United States Patent
Hu et al.

(10) Patent No.: US 12,287,521 B2
(45) Date of Patent: Apr. 29, 2025

(54) PHOTODETECTOR WITH RESONANT WAVEGUIDE STRUCTURE

(71) Applicant: WUHAN OPTICAL VALLEY INFORMATION OPTOELECTRONICS INNOVATION CENTER CO., LTD, Hubei (CN)

(72) Inventors: Xiao Hu, Wuhan (CN); Xi Xiao, Wuhan (CN); Daigao Chen, Wuhan (CN); Lei Wang, Wuhan (CN); Yuguang Zhang, Wuhan (CN); Miaofeng Li, Wuhan (CN)

(73) Assignee: WUHAN OPTICAL VALLEY INFORMATION OPTOELECTRONICS INNOVATION CENTER CO., LTD, Hubei (CN)

( * ) Notice: Subject to any disclaimer, the term of this patent is extended or adjusted under 35 U.S.C. 154(b) by 854 days.

(21) Appl. No.: 17/435,837

(22) PCT Filed: Dec. 4, 2020

(86) PCT No.: PCT/CN2020/134064
§ 371 (c)(1),
(2) Date: Sep. 2, 2021

(87) PCT Pub. No.: WO2022/021724
PCT Pub. Date: Feb. 3, 2022

(65) Prior Publication Data
US 2022/0350090 A1   Nov. 3, 2022

(30) Foreign Application Priority Data

Jul. 30, 2020 (CN) .......................... 202010753468.3

(51) Int. Cl.
*G02B 6/42* (2006.01)
*G02B 6/293* (2006.01)
(Continued)

(52) U.S. Cl.
CPC ....... *G02B 6/4215* (2013.01); *G02B 6/29338* (2013.01); *G02B 6/29395* (2013.01);
(Continued)

(58) Field of Classification Search
CPC .............. G02B 6/4215; G02B 6/29338; G02B 6/29395; H01L 31/02327; H01L 31/024;
(Continued)

(56) References Cited

U.S. PATENT DOCUMENTS 10,630,393 B2   4/2020   Wade et al.
2006/0078254 A1   4/2006   Djordjev
(Continued)

FOREIGN PATENT DOCUMENTS

CA   2887439 A1 *   4/2014   .............. G02F 1/011
CN   201897570 U   7/2011
(Continued)

*Primary Examiner* — Leslie C Pascal
(74) *Attorney, Agent, or Firm* — Cooper Legal Group, LLC

(57) ABSTRACT

Disclosed is a photodetector with a resonant waveguide structure, including: a substrate; a light absorption layer located on the substrate and configured for detecting an optical signal; a resonant waveguide structure including a first waveguide portion and a second waveguide portion spaced apart; the first waveguide portion receives the optical signal and transmits the received optical signal to a first region of the second waveguide portion, the second waveguide portion includes a second region for coupling the optical signal to the light absorption layer, and the second waveguide portion provides a circular transmission path for transmission of the optical signal to transmit the optical (Continued)

signal that transmitted to the first region to the second region along part of the circular transmission path and retransmit the optical signal that flows through the second region without being coupled to the light absorption layer to the second region along the circular transmission path.

19 Claims, 6 Drawing Sheets

(51) Int. Cl.
  *H04B 10/25* (2013.01)
  *H10F 30/225* (2025.01)
  *H10F 71/00* (2025.01)
  *H10F 77/122* (2025.01)
  *H10F 77/40* (2025.01)
  *H10F 77/60* (2025.01)
(52) U.S. Cl.
  CPC ..... *H10F 30/2255* (2025.01); *H10F 71/1212* (2025.01); *H10F 77/122* (2025.01); *H10F 77/413* (2025.01); *H10F 77/60* (2025.01); *H04B 10/25* (2013.01)
(58) Field of Classification Search
  CPC ............... H01L 31/028; H01L 31/1075; H01L 31/1808; H01L 31/107; H04B 10/25
  See application file for complete search history.

(56) References Cited

U.S. PATENT DOCUMENTS

| | | | |
|---|---|---|---|
| 2009/0324163 | A1 | 12/2009 | Dougherty |
| 2013/0044973 | A1* | 2/2013 | Akiyama ............... G02F 1/0121 385/2 |
| 2014/0110572 | A1* | 4/2014 | Li ........................... G02F 1/025 250/227.23 |
| 2015/0108327 | A1* | 4/2015 | Huang ............... H01L 31/03529 257/438 |
| 2018/0062761 | A1 | 3/2018 | Wade et al. |
| 2019/0204504 | A1* | 7/2019 | Chiles .................. G02B 6/0056 |
| 2022/0026634 | A1* | 1/2022 | Bahadori ........... G02B 6/29338 |

FOREIGN PATENT DOCUMENTS

| | | | | |
|---|---|---|---|---|
| CN | 105388638 | A | | 3/2016 |
| CN | 106444092 | A | | 2/2017 |
| CN | 110168444 | A | | 8/2019 |
| CN | 110379871 | A | | 10/2019 |
| CN | 110729373 | A | | 1/2020 |
| CN | 111129202 | A | | 5/2020 |
| CN | 111628036 | A | | 9/2020 |
| CN | 212255792 | U | * | 12/2020 |
| CN | 112786717 | A | * | 5/2021 ......... H01L 27/1446 |
| WO | WO-2019195988 | A1 | * | 10/2019 ............. H01S 5/026 |

* cited by examiner

PHOTODETECTOR WITH RESONANT WAVEGUIDE STRUCTURE

CROSS-REFERENCE TO RELATED APPLICATION

This application is based on and claims priority to Chinese patent application No. 202010753468.3, filed on Jul. 30, 2020, the contents of which are hereby incorporated by reference in its entirety.

TECHNICAL FIELD

The present disclosure relates to the field of photonic integrated chip detection technology, and more particularly, to a photodetector with a resonant waveguide structure.

BACKGROUND

A photodetector is one of key optoelectronic devices in optical communication, optical interconnection and optoelectronic integration technology, and are widely used in various fields of military and national economy. However, the existing photodetector has disadvantages such as low quantum efficiency and low responsivity, and therefore need to be further improved.

SUMMARY

In view of the above, embodiments of the present disclosure provide a photodetector with a resonant waveguide structure in order to solve at least one of the problems in the background.

In order to achieve the above object, the technical solutions of the embodiments of the present disclosure are implemented as follows.

The embodiments of the present disclosure provide a photodetector with a resonant waveguide structure, which includes a substrate, a light absorption layer and a resonant waveguide structure.

The light absorption layer is located on the substrate and configured for detecting an optical signal.

The resonant waveguide structure includes a first waveguide portion and a second waveguide portion spaced apart from each other.

The first waveguide portion is configured to receive the optical signal and transmit the received optical signal to a first region of the second waveguide portion.

The second waveguide portion further includes a second region configured to couple the optical signal to the light absorption layer, and the second waveguide portion provides a circular transmission path for transmission of the optical signal, so as to transmit the optical signal that transmitted to the first region to the second region along part of the circular transmission path and retransmit the optical signal that flows through the second region without being coupled to the light absorption layer to the second region along the circular transmission path.

In an optional embodiment of the present disclosure, the second waveguide portion has a smaller ring width in the second region than that in the first region.

The ring width represents a distance between an outer wall and an inner wall of the second waveguide portion in a direction perpendicular to a transmission direction of the optical signal.

In an optional embodiment of the present disclosure, the ring width of the second waveguide portion decreases gradually in a front end region of the second region and increases gradually in a rear end region of the second region along the transmission direction of the optical signal The front end region is a region on the second waveguide portion where the optical signal is transmitted to the second region, and the rear end region is a region on the second waveguide portion where the optical signal is transmitted from the second region.

In an optional embodiment of the present disclosure, the second region of the second waveguide portion is a straight waveguide region, and the second waveguide portion includes at least a curved waveguide region to connect both ends of the straight waveguide region to form the circular transmission path.

In an optional embodiment of the present disclosure, the first waveguide portion is a straight waveguide, and an extension direction of the first waveguide portion is perpendicular to an extension direction of the second region of the second waveguide portion.

In an optional embodiment of the present disclosure, the first waveguide portion and the second waveguide portion are sequentially arranged along a direction parallel to a plane of the substrate, and the first waveguide portion is located outside the first region of the second waveguide portion.

In an optional embodiment of the present disclosure, a spacing between the first waveguide portion and the second waveguide portion is ranged from 150 nm to 600 nm.

In an optional embodiment of the present disclosure, the second region of the second waveguide portion is located right above the light absorption layer and spaced a certain distance from an upper surface of the light absorption layer.

In an optional embodiment of the present disclosure, a spacing between the second region of the second waveguide portion and the light absorption layer is ranged from 100 nm to 1000 nm.

In an optional embodiment of the present disclosure, the second waveguide portion further includes a third region.

The photodetector further includes a thermal regulation structure disposed around the third region, and the thermal regulation structure is configured to regulate a temperature to change an operation wavelength of the photodetector.

In an optional embodiment of the present disclosure, a spacing between the third region of the second waveguide portion and the thermal regulation structure is greater than or equal to 1.5 μm.

In an optional embodiment of the present disclosure, the third region and the second region of the second waveguide portion are disposed opposite each other.

The first region connects the second region and the third region.

In an optional embodiment of the present disclosure, the third region is a straight waveguide region, and an extension direction of the third region is parallel to an extension direction of the second region.

In an optional embodiment of the present disclosure, the photodetector further includes at least two metal electrodes.

A spacing between the resonant waveguide structure and any metal electrode is greater than or equal to 500 nm.

In an optional embodiment of the present disclosure, the substrate is a silicon-on-insulator substrate.

The light absorption layer is a germanium layer.

A bottom end of the light absorption layer is embedded in a top silicon layer of the silicon-on-insulator substrate.

In an optional embodiment of the present disclosure, the photodetector further includes a multiplication region.

The multiplication region and the light absorption layer are sequentially arranged along a direction parallel to a plane of the substrate to form a transverse avalanche photodetector.

In an optional embodiment of the present disclosure, the photodetector further includes a first charge region and a second charge region formed in a partial region of the substrate, and the first charge region and the second charge region are located on both sides of the absorption layer along a direction parallel to a plane of the substrate.

In an optional embodiment of the present disclosure, the resonant waveguide structure is a silicon nitride resonant waveguide structure.

The embodiments of the present disclosure provide a photodetector with a resonant waveguide structure, which includes a substrate, a light absorption layer and a resonant waveguide structure. The light absorption layer is located on the substrate and configured for detecting an optical signal. The resonant waveguide structure includes a first waveguide portion and a second waveguide portion spaced apart from each other, the first waveguide portion is configured to receive the optical signal and transmit the received optical signal to a first region of the second waveguide portion, the second waveguide portion further includes a second region configured to couple the optical signal to the light absorption layer, and the second waveguide portion provides a circular transmission path for transmission of the optical signal, so as to transmit the optical signal that transmitted to the first region to the second region along part of the circular transmission path and retransmit the optical signal that flows through the second region without being coupled to the light absorption layer to the second region along the circular transmission path. In this way, the first waveguide portion receives the optical signal and transmits the optical signal to the second waveguide portion, which can generate optical enhancement effect and improve quantum efficiency; and the optical signal is circularly transmitted at the second waveguide portion and can be retransmitted to the second region coupled to the light absorption layer, thereby increasing the number of coupling times and improving responsivity of the detector.

The additional aspects and advantages of the embodiments of the present disclosure will be set forth partly in the following description, and part will be apparent from the following description, or be learned by practice of the embodiments of the present disclosure.

REFERENCE SIGNS DESCRIPTION

Figure 1A:
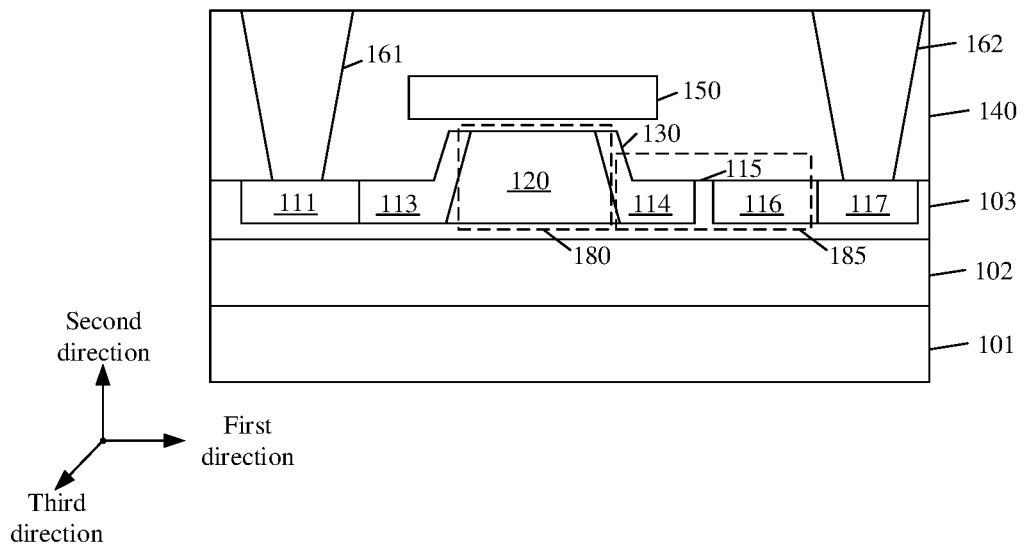
FIG. 1a and FIG. 1B are structural sectional view and top view of a photodetector with a resonant waveguide structure according to the embodiments of the present disclosure.

101—Bottom silicon layer; 102—Buried oxide layer; 103—Top silicon layer;
111—First contact region; 113—First charge region; 114—Second charge region; 115-I- intrinsic region; 116—N+ doped region; 117—Second contact region;
120—Light absorption layer;
130—Second epitaxial growth layer;
140—Fill layer;
150—Resonant waveguide structure; 151—First waveguide portion; 152—Second waveguide portion; 152-1—First region; 152-2—Second region; 152-3—Third region; 152-4—Fourth region;
161—First metal electrode; 162—Second metal electrode;
180—Absorption region; 185—Multiplication region;
190—Thermal regulation structure.

DETAILED DESCRIPTION

Exemplary embodiments of the present disclosure will be described in more detail below with reference to the accompanying drawings. While the exemplary implementations of the present disclosure are shown in the accompanying drawings, it should be understood that the present disclosure may be implemented in various forms and should not be limited to the specific implementations set forth herein. Instead, these embodiments are provided to enable this disclosure to be more thoroughly understood, and more fully convey the scope of the embodiments disclosed herein to those skilled in the art.

Numerous specific details are set forth in the following description to provide a more thorough understanding of embodiments of the present disclosure. However, it is apparent to those skilled in the art that embodiments of the present disclosure may be implemented without one or more of these details. In other examples, some of the technical features known in the art have not been described in order to avoid confusion with the embodiments of the present disclosure; that is, all features of the actual embodiments are not described herein, and well-known functions and structures are not described in detail.

In the accompanying drawings, the sizes of the layers, regions, elements and their relative sizes may be exaggerated for clarity. The same reference numerals represent the same elements throughout.

It is to be understood that when an element or a layer is referred to as "on", "adjacent to", "connected to" or "coupled to" other elements or layers, it can be directly on, adjacent to, connected to or coupled to the other elements or layers, or intervening elements or layers may be present. On the contrary, when an element is referred to as "directly on", "directly adjacent to", "directly connected to" or "directly coupled to" other elements or layers, there are no intervening elements or layers. It is to be understood that although the terms "first", "second", "third", etc. may be used to describe various elements, components, regions, layers and/or portions, these elements, components, regions, layers and/or portions should not be limited by these terms. These terms are only used to distinguish one element, component, region, layer or portion from another element, component, region, layer or portion. Thus, a first element, component, region, layer or portion discussed below may be represented as a second element, component, region, layer or portion without departing from the teaching of the embodiments of the present disclosure. However, when the second element, component, region, layer or portion is discussed, it does not indicate that the first element, component, region, layer or portion is necessarily present in the embodiments of the present disclosure.

Spatial relationship terms such as "under", "below", "underneath", "beneath", "on the top of", "above", etc. can be used herein to describe conveniently the relationship between one element or feature and other elements or features shown in the figures. It is to be understood that, in addition to the orientations shown in the figures, the spatial relationship terms are intended to indicate different orientations of the devices in use and operation. For example, if the device in the accompanying drawings is turned over, the elements or features which described as "below other components", "under it" or "below it" will be oriented "on" other elements or features. Thus, the exemplary terms "below" and "under" may include both upper and lower orientations. The device may be otherwise oriented (rotated 90 degrees or other orientation) and the spatial terms used herein are interpreted accordingly.

The term used herein is for the purpose of describing specific embodiments only and is not intended to limit the embodiments of the present disclosure. As used herein, the singular forms "a", "an" and "the" are also intended to include the plural forms unless the context clearly dictates another way. It is also to be understood that the terms "form" and/or "include", when used in this specification, determine the existence of the features, integers, steps, operations, elements and/or components, but do not exclude the existence or addition of one or more other features, integers, steps, operations, elements, components and/or groups. As used herein, the term "and/or" includes any and all combinations of related listed items.

In order to thoroughly understand the embodiments of the present disclosure, detailed operations and detailed structures will be set forth in the following description for illustrating the technical solution of the embodiments of the present disclosure. Optional embodiments of the present disclosure are described in detail as follows, however, the present disclosure may have other embodiments in addition to these detailed descriptions.

Silicon photonic technology is a new generation of technology for optical device development and integration by using existing complementary metal oxide semiconductor (CMOS) processes based on silicon and silicon-based substrate materials (such as SiGe/Si, silicon-on-insulator, etc.). Silicon photonic technology combines characteristics of ultra-large-scale and ultra-high-precision manufacturing of the integrated circuit technology with advantages of ultra-high speed and ultra-low power consumption of the photonic technology, which is a disruptive technology to deal with the failure of Moore's law. This combination benefits from the extendibility of the semiconductor wafer fabrication, which can reduce the cost. As one of the core devices of the silicon photonic architecture, a photodetector has a function of converting an optical signal to an electrical signal. However, due to the band structure of the crystalline silicon material, detection efficiency of the crystalline silicon material in the optical communication band is very low, while the 111-V group semiconductor material, which is more suitable for a photodetector, is not compatible with the silicon process and cannot be effectively monolithically integrated with silicon. Taking the compatibility of germanium materials with CMOS processes into account, the technology of forming a silicon germanium photodetector by using germanium materials as light absorption layer materials has been proposed in the art.

The silicon photonic integrated chip can use silicon germanium material compatible with CMOS process to realize avalanche photodetection, in which silicon material is used as an optical waveguide and an avalanche gain region at the same time, and germanium material is used to absorb photons.

Existing photodetectors generally have the disadvantages of low quantum efficiency, low responsivity and the like. Moreover, the electric field distribution in the absorption region is nonuniform, which results in reduction in responsivity, and the absorption region is too large, which easily results in unsatisfactory gain bandwidth product. Furthermore, for an avalanche photodetector structure that an optical signal is conducted into the interior of the structure by means of a silicon slab waveguide and then the light carrying the signal is coupled into the germanium layer, the silicon material is used as a waveguide for transmitting the light on the one hand, and on the other hand, the silicon material is doped with P or N-type to form an electric field to extract photogenerated carriers, and the germanium material absorption region is also doped with P or N-type, however. These doping may results in the light absorption loss, and further reduces quantum efficiency of the detector.

Based on this, the following technical solutions of the embodiments of the present disclosure are provided.

The embodiments of the present disclosure provide a photodetector with a resonant waveguide structure, which includes a substrate, a light absorption layer and a resonant waveguide structure. The light absorption layer is located on the substrate and configured for detecting an optical signal, and the resonant waveguide structure includes a first waveguide portion and a second waveguide portion spaced apart from each other. The first waveguide portion is configured to receive the optical signal and transmit the received optical signal to a first region of the second waveguide portion, the second waveguide portion further includes a second region configured to couple the optical signal to the light absorption layer, and the second waveguide portion provides a circular transmission path for transmission of the optical signal, so as to transmit the optical signal that transmitted to the first region to the second region along part of the circular transmission path and retransmit the optical signal that flows through the second region without being coupled to the light absorption layer to the second region along the circular transmission path.

The substrate may be an elemental semiconductor material substrate (for example, a silicon (Si) substrate, a germanium (Ge) substrate, etc.), a composite semiconductor material substrate (for example, a silicon germanium (SiGe) substrate, etc.), a silicon-on-insulator (SOI) substrate, a germanium-on-insulator (GeOI) substrate, or the like.

The following is described with reference to FIG. 1a. In the embodiments of the present disclosure, the substrate is an SOI substrate as an example for description. The SOI substrate includes a bottom silicon layer 101, a buried oxide layer 102 and a top silicon layer 103. For example, the buried oxide layer 102 is a silicon dioxide layer. The thickness of the bottom silicon layer 101 may be greater than that of the top silicon layer 103. It is to be understood that, in order to make each layer structure to be clearly shown in the figures, the proportional relationship between dimensions of layer structures may be inconsistent with the actual structure.

The substrate may include a top surface at a front side and a bottom surface at a back side opposite to the front side. In the case of ignoring the flatness of the top surface and the bottom surface, a direction perpendicular to the top surface and the bottom surface of the substrate is defined as a second direction. The second direction is also a stacking direction of subsequent deposition of each layer structure on the substrate, or a height direction of the device. The plane where the top surface and the bottom surface of the substrate are located, or a center plane in a thickness direction of the substrate in a strict sense, is determined as a plane of the substrate, and a direction parallel to the plane of the substrate is a direction along the plane of the substrate. Two intersecting first and third directions are defined in the direction of the plane of the substrate. For example, the first direction and the third direction are two directions perpendicular to each other. In this embodiment, the first direction is a width direction of device or a movement direction of the current, and the third direction is a propagation direction of the optical signal transmitted above the light absorption layer.

The light absorption layer 120 is located on the substrate and configured for detecting the optical signal. The light absorption layer may further convert the incident optical signal into multiple electron-hole pairs which flow to the electrode under the electric field to form the photocurrent. Further, the photocurrent is conducted through a pair of metal electrodes to implement the photodetection. The light absorption layer 120 forms an absorption region (180 in FIG. 1a) of the photodetector.

In a specific embodiment, the light absorption layer is a germanium layer. The substrate includes a silicon material region, and the photodetector is a silicon germanium photodetector.

The photodetector also includes the resonant waveguide structure 150. Referring to FIG. 1a and FIG. 1B, the resonant waveguide structure 150 includes a first waveguide portion 151 and a second waveguide portion 152 spaced apart from each other.

The first waveguide portion 151 is configured to receive the optical signal and transmit the received optical signal to a first region 152-1 of the second waveguide portion 15. The second waveguide portion 152 further includes a second region 152-2 configured to couple the optical signal to the light absorption layer 120. The second waveguide portion 152 provides a circular transmission path for transmission of the optical signal, so as to transmit the optical signal that transmitted to the first region 152-1 to the second region 152-2 along part of the circular transmission path and retransmit the optical signal that flows through the second region 152-2 without being coupled to the light absorption layer 120 to the second region 152-2 along the circular transmission path. The details may refer to the dashed arrow path in FIG. 1a and FIG. 1B.

It is to be understood that the first waveguide portion and the second waveguide portion are spaced apart from each other, which indicates there is no connection region between the first waveguide portion and the second waveguide portion. In the actual application, the first waveguide portion and the second waveguide portion may be spaced apart by a fill layer (refer to 140 in FIG. 1a). In a resonant state, the first waveguide portion and the second waveguide portion transmit the optical signal by the coupling effect; that is, the first waveguide portion couples the received optical signal to the first region of the second waveguide portion.

The second waveguide portion provides the circular transmission path for transmission of the optical signal, which may be understood that the second waveguide portion has a circular optical signal transmission path; in particular, it can be realized by setting the second waveguide part to be a ring shape. The ring herein includes a regular ring, an elliptical ring, as well as other arbitrarily closed rings.

The first region and the second region are both located on the circular transmission path so that the optical signal sequentially passes through the first region and the second region when the optical signal is transmitted on the circular transmission path. A distance from the first region to the second region is smaller than a distance from the second region to the first region along the propagation direction of the optical signal. The distance from the first region to the second region may be zero, in other words, the first region and the second region may be directly connected, and the first region and the second region are both part of the circular transmission path.

For the second waveguide portion, it is necessary to reduce the loss of the optical signal in the cyclic transmission process as much as possible, and also to improve the coupling efficiency between the second region and the light absorption layer as much as possible. In a specific embodiment, the second waveguide portion has a smaller ring width in the second region than that in the first region. The ring width represents a distance between an outer wall and an inner wall of the second waveguide portion in a direction perpendicular to a transmission direction of the optical signal.

In order to avoid a large loss of the optical signal at the position where the ring width of the second waveguide portion changes, in a specific embodiment, the ring width of the second waveguide portion decreases gradually in a front end region of the second region and increases gradually in a rear end region of the second region along the transmission direction of the optical signal. The front end region is a region on the second waveguide portion where the optical signal is transmitted to the second region, and the rear end region is a region on the second waveguide portion where the optical signal is transmitted from the second region.

Figure 2:
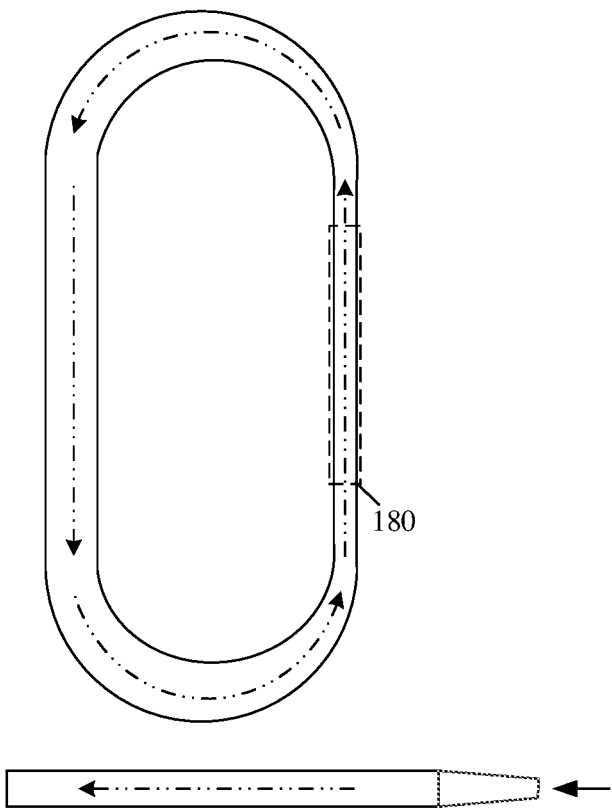
FIG. 2 is a structural top view of an implementation of a resonant waveguide structure.

The following is described with reference to FIG. 2. As shown in FIG. 2, the second waveguide portion has a smaller ring width in the second region corresponding to the light absorption layer (i.e., corresponding to the absorption region 180). The second waveguide portion has a smaller ring width in the second region than that in the first region. Further, the second waveguide portion has a smaller ring width in the second region than that in other regions, that is, the ring width in the second region of the second waveguide portion is the smallest.

It is to be noted that FIG. 2 shows a case where the ring width of the second waveguide portion in the second region is uniform, the present disclosure is not limited thereto. The ring width of the second waveguide portion in the second region may decrease gradually along the transmission direction of the optical signal, or may gradually decrease and then gradually increase along the transmission direction of the optical signal. The ring width at any position in the second region is smaller than the ring width at any position in the first region. Further, the ring width at any position in the second region may also be smaller than the ring width at any position in the region except the second region on the second waveguide portion.

Along the transmission direction of the optical signal, the second waveguide portion further includes a front end region of the second region and a rear end region of the second region, both of which respectively refer to a region on the second waveguide portion where the optical signal is transmitted to the second region (the region located below 180 in FIG. 2) and a region where the optical signal is transmitted from the second region (the region located above 180 in FIG. 2). Since the second waveguide portion has a smaller ring width in the second region, in order to avoid the large loss of the optical signal at the position where the ring width of the second waveguide portion changes, the ring width of the second waveguide portion decreases gradually in the front end region of the second region and increases gradually in the rear end region of the second region.

In a specific embodiment, the second region of the second waveguide portion is a straight waveguide region, and the second waveguide portion includes at least a curved waveguide region to connect both ends of the straight waveguide region to form the circular transmission path.

The first implementation may refer to the FIG. 1B. The second waveguide portion 152 has a racetrack shape, the second waveguide portion 152 includes two straight waveguide regions (refer to 152-2 and 152-3 in FIG. 1B) opposite to each other, and two curved waveguide regions (refer to 152-1 and 152-4 in FIG. 1B) connects the two straight waveguide regions at both ends of the two straight waveguide regions. One straight waveguide region serves as the second region 152-2 and one curved waveguide region serves as the first region 152-1.

Figure 3A:
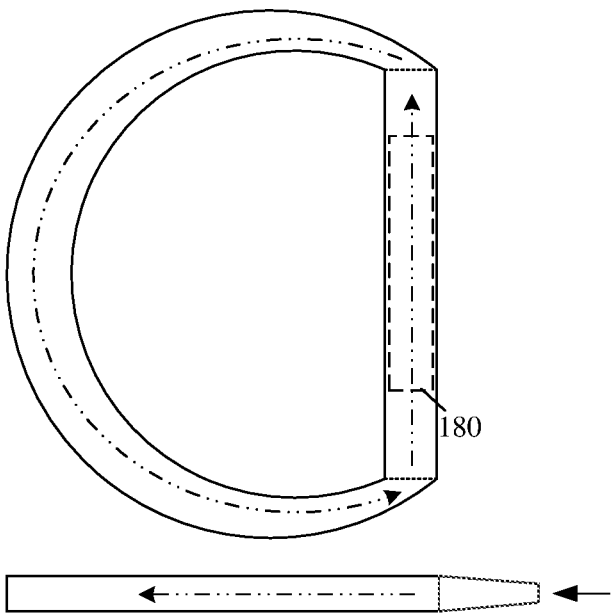
FIG. 3a to FIG. 3b are structural top views of other implementations of a resonant waveguide structure.

The second implementation may refer to FIG. 3a. The second waveguide portion includes a straight waveguide region and a curved waveguide region. The straight waveguide region serves as the second region, and part of the curved waveguide region near the first waveguide portion serves as the first region. The curved waveguide region may be an arc ring or an elliptical arc ring which connected to the straight waveguide region.

Figure 3B:
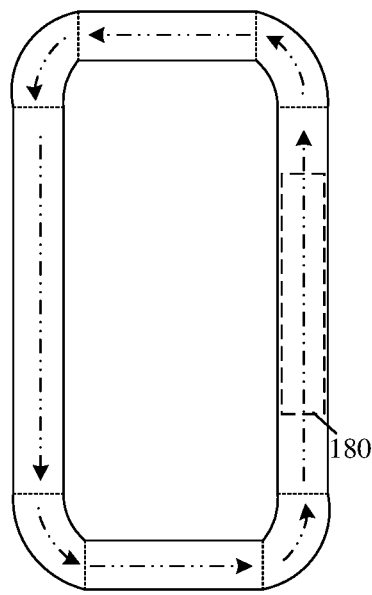

The third implementation may refer to FIG. 3b. The second waveguide portion includes four straight waveguide regions and four curved waveguide regions. The four straight waveguide regions and the four curved waveguide regions are connected spaced, and every two straight waveguide regions among the four straight waveguide regions may be arranged opposite to each other in parallel. In one embodiment, the first region and the second region of the second waveguide portion are both straight waveguide regions, and the second waveguide portion includes at least two curved waveguide regions, in which one curved waveguide region connects two ends of the first region and the second region adjacent to each other, and the other curved waveguide region connects two ends of the first region and the second region away from each other.

Other possible implementations are conceivable by those skilled in the art according to the concepts of the embodiments of the present disclosure, which are not exhaustive herein. Other modifications, equivalents, and simple variations, which are within the spirit and principles of the embodiments of the present disclosure, should be included within the protection scope of the embodiments of the present disclosure.

The first waveguide portion 151 may be a straight waveguide, and an extension direction of the first waveguide portion 151 is perpendicular to an extension direction of the second region 152-2 of the second waveguide portion 152. As shown in FIG. 1B, the first waveguide portion 151 extends along the first direction, a solid arrow on the right side of the first waveguide portion 151 shows an incoming direction of the optical signal, and a dashed arrow within the first waveguide portion 151 shows the transmission direction of the optical signal within the first waveguide portion 151.

The first waveguide portion 151 and the second waveguide portion 152 are sequentially arranged along a direction parallel to a plane of the substrate. The first waveguide portion 151 is located outside the first region 152-1 of the second waveguide portion 152.

In a specific embodiment, a spacing between the first waveguide portion and the second waveguide portion is 150 nm~600 nm. In an embodiment in which the first waveguide portion and the first region of the second waveguide portion are both straight waveguides, the spacing is a vertical distance between the two straight waveguides. In an embodiment in which the first waveguide portion is a straight waveguide and the first region of the second waveguide portion is a curved waveguide, the spacing is a vertical distance between the first waveguide portion and a point on the first region closest to the first waveguide portion.

The length of the second waveguide portion along the third direction may be greater than that along the first direction.

The size of the second waveguide portion in the second direction (i.e., the thickness of the second waveguide portion) is in a range of 100 nm~800 nm, and the size of the second region of the second waveguide portion in the first direction (i.e., the ring width of the second waveguide portion in the second region) is in a range of 500 nm~2000 nm. Further, the ring width of the second waveguide portion in other regions may also be in the range of 500 nm~2000 nm.

In the embodiments of the present disclosure, the second region of the second waveguide portion is located right above the light absorption layer and is spaced a certain distance from an upper surface of the light absorption layer. Thus, the upper surface of the light absorption layer is a light absorption surface of the light absorption layer. In a specific embodiment, a spacing between the second region of the second waveguide portion and the light absorption layer is ranged from 100 nm to 1000 nm.

In this embodiment, the resonant waveguide structure may specifically be a silicon nitride resonant waveguide structure. In other words, the material of the first waveguide portion and the second waveguide portion may include silicon nitride.

It is to be understood that the silicon nitride material is used to form the silicon nitride resonant waveguide structure for transmitting the optical signal, which can avoid absorption losses due to simultaneous P or N-type doping of the silicon slab waveguide.

In other embodiments, the resonant waveguide structure may also be a silicon resonant waveguide structure. The material of the first waveguide portion and the second waveguide portion may also be silicon.

With continued reference to FIG. 1B, in the photodetector with the resonant waveguide structure, the second waveguide portion 152 further includes a third region 152-3. The photodetector further includes a thermal regulation structure 190 disposed around the third region 152-3, and the thermal regulation structure 190 is configured to regulate a temperature to change an operation wavelength of the photodetector.

The material of the thermal regulation structure may specifically be TiN.

A spacing between the third region of the second waveguide portion and the thermal regulation structure is greater than or equal to 1.5 μm.

In a specific embodiment, the third region and the second region of the second waveguide portion are disposed opposite each other, and the first region connects the second region and the third region.

In the embodiments shown in FIG. 1B and FIG. 2, the third region is a straight waveguide region. An extension direction of the third region is parallel to an extension direction of the second region.

The second waveguide portion may have a smaller ring width in the second region than that in the third region. The ring width of the second waveguide portion in the third region may be equal to that in the first region.

Figure 1B:
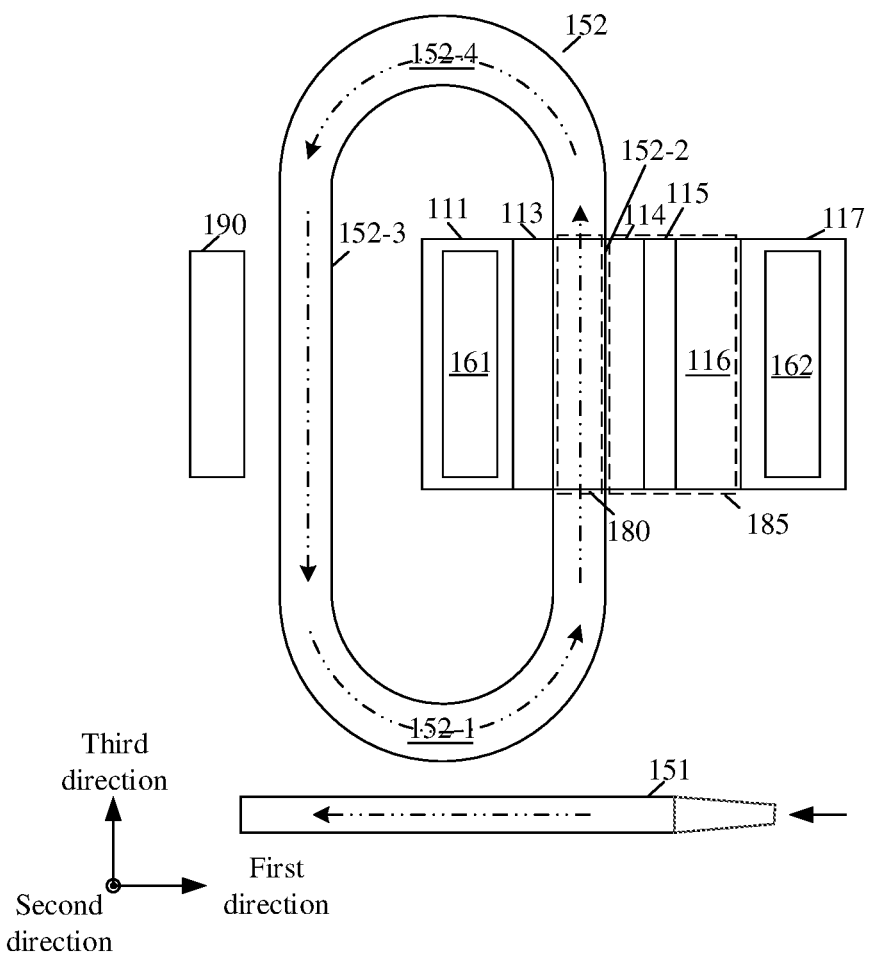

With continued reference to FIG. 1a to FIG. 1b, the photodetector with the resonant waveguide structure may further include at least two metal electrodes, i.e., a first metal electrode 161 and a second metal electrode 162, and a spacing between the resonant waveguide structure 150 and any metal electrode is greater than or equal to 500 nm. In this way, it is avoided that the first metal electrode 161 or the second metal electrode 162 absorbs the optical signal, thereby generating heat energy and causing loss.

For example, the first metal electrode 161 and the second metal electrode 162 are in contact with a first contact region 111 and a second contact region 117 formed on the substrate, respectively. The doping types of the first contact region 111 and the second contact region 117 are opposite, for example, the first contact region 111 may be a P++ contact region and the second contact region 117 may be an N++ contact region. In a specific embodiment, a spacing between the second region 152-2 and/or the third region 152-3 of the resonant waveguide structure 150 and the first metal electrode 161 connected to the P++ contact region is greater than or equal to 500 nm. The spacing is a distance along the first direction.

In the embodiments where the substrate is the SOI substrate, the first contact region 111 and the second contact region 117 may be located within a top silicon layer 103 of the SOI substrate. Along a direction from the first contact region 111 to the second contact region 117, a first charge region 113, a second charge region 114, an I-intrinsic region 115 and an N+ doped region 116 may also be sequentially arranged between the first contact region 111 and the second contact region 117. The first charge region 113 and the second charge region 114 have P-type doping, and specifically may be P+ doped regions.

In the embodiments where the substrate is the SOI substrate, a bottom end of the light absorption layer 120 is embedded in the top silicon layer 103 of the SOI substrate. The light absorption layer 120 may be a first epitaxial growth layer, which is specifically formed on the substrate by using the second semiconductor material different from the substrate material. A lower surface of the light absorption layer 120 is lower than the upper surface of the top silicon layer 103. For example, the second semiconductor material is germanium.

In the embodiment where the substrate is the elemental semiconductor material substrate, the light absorption layer is located on the substrate, which includes: the light absorption layer is located in a groove on the substrate, so that the lower surface of the light absorption layer is embedded in the substrate.

In this way, the generated photocurrent may be moved along a linear direction (e.g., the first direction) substantially parallel to the plane of the substrate, so that the electric field distribution in the light absorption layer is more uniform, thereby facilitating to transmit the photogenerated carriers and improve the gain bandwidth product.

The doping concentration of the P++ contact region and the N++ contact region is in a range of $1\times10^{20}/cm^3 \sim 5\times10^{20}/cm^3$, the doping concentration of the P+ doped region and the N+ doped region is in a range of $2\times10^{17}/cm^3 \sim 5\times10^{18}/cm^3$, the concentration of the I-intrinsic region is less than or equal to ($\leq$) $1\times10^{17}/cm^3$, and the doping concentration of the absorption region is less than or equal to ($\leq$) $5\times10^{17}/cm^3$. The absorption region may be an intrinsic region, or may be a lightly doped region.

A distance between the absorption region and any one of the P++ contact region and the N++ contact region in a first direction is greater than or equal to 1.5 μm.

The dimension of the I-intrinsic region in the first direction is in a range of 60 nm~600 nm.

Referring to FIG. 1a to FIG. 1B, when the photodetector further includes the first charge region 113 and the second charge region 114 formed in a partial region of the substrate, the first charge region 113 and the second charge region 114 are located on both sides of the light absorption layer 120 along a direction parallel to the plane of the substrate. Specifically, the first charge region 113 and the second charge region 114 are located on both sides of the light absorption layer 120 along a connection direction of the first contact region 111 and the second contact region 117.

In this embodiment, both sides of the light absorption layer 120 include two charge regions. In this way, the electric field strength in the light absorption layer can be independently adjusted, which is beneficial to reduce the dark current of the photodetector.

The dimensions of the first charge region and the second charge region in the first direction are in the range of 50 nm~400 nm, the dimension in the second direction is in the range of 100 nm~500 nm (which may be determined by the structure dimension and the doping depth of the position), and the dimension in the third direction is in the range of 1 μm~20 μm. The dimensions of the first charge region, the second charge region and the light absorption layer in the third direction may be the same.

In one embodiment, the photodetector with the resonant waveguide structure further includes a multiplication region. The multiplication region and the light absorption layer are sequentially arranged in the direction parallel to the plane of the substrate to form a transverse (or "lateral") avalanche photodetector.

The multiplication region refers to a region where carrier multiplication occurs. A absorption region of the avalanche photodetector can convert the incident optical signal into multiple electron-hole pairs which flow to the electrode under the electric field to form the photocurrent. The multiplication region can further amplify the photocurrent formed in the absorption region under the effect of avalanche multiplication; further, the photocurrent is conducted through a pair of metal electrodes to achieve the photodetection.

Since any semiconductor material can be used in the multiplication region in theory, the multiplication region is not strictly limited herein. In the embodiments where the substrate is the elemental Si substrate or the SOI substrate, the multiplication region is formed in the Si material.

As a specific implementation, the multiplication region may include the P+ doped region (charge region), the I-intrinsic region (avalanche region) and the N+ doped region which are sequentially arranged in a direction from close to the absorption region to away from the absorption region. Referring to FIG. 1a, the multiplication region 185 includes the second charge region 114, the I-intrinsic region 115 and the N+ doped region 116.

The second waveguide portion 152 of the resonant waveguide structure 150 forms the circular optical signal transmission path in a direction away from the multiplication region 185. That is, the part, closest to the multiplication region 185, of the second waveguide portion 152 is the second region 152-2.

It is to be noted that the second waveguide portion 152 corresponds to an active region on the substrate only through the second region, and the active region includes the first contact region 111, the first charge region 113, the second charge region 114, the I-intrinsic region 115, the N+ doped region 116 and the region where the light absorption layer 120 is located. In order to further shorten the circular optical signal transmission path of the second waveguide portion, the first contact region 111 and the first charge region 113 may contact directly, and there is no I-intrinsic region between them.

The absorption region 180 and the multiplication region 185 at least partially overlap along the direction of the plane of the substrate, that is, the projections of the absorption region 180 and the multiplication region 185 in a plane perpendicular to the direction of the plane of the substrate (e.g., a plane determined by the second direction and the third direction) at least partially overlap. In this way, the generated photocurrent can be moved along the linear direction (e.g., the first direction) substantially parallel to the plane of the substrate, so that the electric field distribution in the absorption region 180 is more uniform.

As shown in FIG. 1B, the absorption region 180 and the multiplication region 185 at least partially overlap along the direction of the plane of the substrate, which includes: the boundaries of the absorption region 180 and the multiplication region 185 along the third direction are aligned with each other, and the widths are substantially equal. In addition, it also includes: the width of the absorption region along the third direction is smaller than the width of the multiplication region along the third direction.

Referring to FIG. 1a, an upper surface of the light absorption layer 120 is higher than an upper surface of the top silicon layer 103 (the substrate).

The dimension of the light absorption layer in the first direction is in the range of 150 nm~1500 nm, the dimension in the second direction is in the range of 150 nm~600 nm, and the dimension in the third direction is in the range of 1 μm~20 μm. In this case, when describing the dimension of the light absorption layer, it is not possible to take the dimension difference between the upper and lower surfaces of the light absorption layer during epitaxial growth process into account.

Referring to FIG. 1a, as a specific implementation, the avalanche photodetector further includes a second epitaxial growth layer 130 (the light absorption layer 120 may be referred to as the "first epitaxial growth layer") formed on the substrate by using a first semiconductor material, and the first semiconductor material is the same as the material of the top silicon layer 103, that is, it may be silicon, specifically polysilicon. The second epitaxial growth layer 130 is located between the substrate (specifically, the top silicon layer 103) and the light absorption layer 120, and one side of the second epitaxial growth layer 130 is in contact with the substrate (the top silicon layer 103) and the other side is in contact with the light absorption layer 120.

There is P-type doping in the second epitaxial growth layer. Thus, the second epitaxial growth layer can be formed as the charge region or part of the charge region of the photodetector. For example, the second epitaxial growth layer is formed as the first charge region 113 and the second charge region 114, or part of the first charge region 113 and part of the second charge region 114.

The upper surface of the second epitaxial growth layer is at least partially coplanar with the upper surface of the first epitaxial growth layer, and the second epitaxial growth layer covers sidewalls of the first epitaxial growth layer. It is to be understood that the upper surface of the second epitaxial growth layer is at least partially coplanar with the upper surface of the first epitaxial growth layer, which may be realized by the planarization process, for example, by the chemical mechanical polishing (CMP) process specifically. The second epitaxial growth layer covers the sidewalls of the first epitaxial growth layer, specifically, the sidewalls of the first epitaxial growth layer are completely covered by the second epitaxial growth layer and the first epitaxial growth layer does not have exposed sidewall regions. The upper surface of the first epitaxial growth layer (i.e., the light absorption layer) is used to absorb the light signal, and the sidewalls (side surfaces or interfaces with the second epitaxial growth layer) are used to transmit the electrical signal.

The material of the second epitaxial growth layer is the same as the material of the substrate/the top silicon layer, so that the second epitaxial growth layer and the substrate/the top silicon layer can be used as indiscriminate material regions subsequently, and the boundaries between them may not be clearly divided.

Figure 4A:
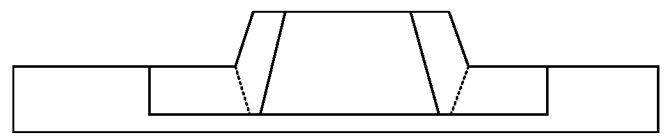
FIG. 4a to FIG. 4e are structural sectional views of different implementations of a second epitaxial growth layer in a photodetector with a resonant waveguide structure.
Figure 4B:
Figure 4C:
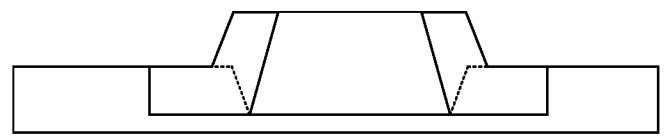
Figure 4D:
Figure 4E:
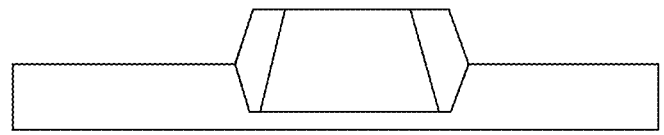

FIG. 4a to FIG. 4e show structural sectional views of different implementations of the second epitaxial growth layer in the photodetector. In each of FIG. 4a to FIG. 4e, the first charge region and the second charge region are respectively shown by solid boundary lines, and the dashed lines in the solid line boundaries indicate the interface between the second epitaxial growth layer within the first charge region or the second charge region and the substrate (specifically, the top silicon layer). In the embodiment shown in FIG. 4a, the lower surface of the second epitaxial growth layer may be in contact with the top silicon layer, and the lower surface is substantially parallel to the upper surface of the top silicon layer; the upper surface of the second epitaxial growth layer may be coplanar with the upper surface of the first epitaxial growth layer; the sidewalls close to the first epitaxial growth layer is in contact with the first epitaxial growth layer (i.e., the second epitaxial growth layer covers the sidewalls of the first epitaxial growth layer); part of the sidewalls away from the first epitaxial growth layer is in contact with the top silicon layer (the dashed lines in FIG. 4a), and another part protrudes above the upper surface of the top silicon layer; and the section of the second epitaxial growth layer has a pentagonal shape. In the embodiment shown in FIG. 4b, the lower surface of the second epitaxial growth layer may be in contact with the top silicon layer, and the lower surface is substantially parallel to the upper surface of the top silicon layer; the upper surface of the second epitaxial growth layer may be coplanar with the upper surface of the first epitaxial growth layer; the sidewalls close to the first epitaxial growth layer is in contact with the first epitaxial growth layer (i.e., the second epitaxial growth layer covers the sidewalls of the first epitaxial growth layer); one part of the sidewalls away from the first epitaxial growth layer is in contact with the top silicon layer (the dashed lines in FIG. 4b), and another part protrudes above the upper surface of the top silicon layer; and the second epitaxial growth layer further includes the part above the top silicon layer. In the embodiment shown in FIG. 4c, the second epitaxial growth layer does not include the lower surface substantially parallel to the upper surface of the top silicon layer, and the lower half of the second epitaxial growth layer is interposed between the first epitaxial growth layer and the top silicon layer in an inverted triangle; and the second epitaxial growth layer further includes the part above the top silicon layer. In the embodiment shown in FIG. 4d, the difference between the second epitaxial growth layer and the second epitaxial growth layer described in the embodiment shown in FIG. 4c is that the second epitaxial growth layer in FIG. 4d does not include the part covering the top silicon layer; the section of the second epitaxial growth layer has a quadrilateral shape; the upper surface of the second epitaxial growth layer may be coplanar with the upper surface of the first epitaxial growth layer; the sidewalls close to the first epitaxial growth layer is in contact with the first epitaxial growth layer (i.e., the second epitaxial growth layer covers the sidewalls of the first epitaxial growth layer); one part of the sidewalls away from the first epitaxial growth layer is in contact with the sidewalls of the top silicon layer (the dashed line in FIG. 4d), and another part protrudes above the upper surface of the top silicon layer; and the lower half of the second epitaxial growth layer is interposed between the first epitaxial growth layer and the top silicon layer in the inverted triangle. In the embodiments shown in FIG. 4a to FIG. 4d, part of the top silicon layer and the second epitaxial growth layer are doped to form the charge region, so that the second epitaxial growth layer may be formed as a part of the charge region. In the embodiment shown in FIG. 4e, the second epitaxial growth layer is doped to form the charge region, so that the second epitaxial growth layer may be formed as a whole of the charge region; part of the top silicon layer in contact with the second epitaxial growth layer may be an I-intrinsic region; and the first epitaxial growth layer is formed as the absorption region. It is to be understood that the above embodiments can be realized by adjusting the dimension and position of the masks during the formation of each structure.

In the embodiments shown in FIG. 4a to FIG. 4e, along the first direction, the second epitaxial growth layer may be formed as two charge regions located on both sides of the absorption region respectively, i.e., a first charge region and a second charge region, or formed as part of each of the two charge regions.

The specific implementation of a silicon germanium avalanche photodetector with a resonant waveguide structure will be described below.

The photodetector may include a silicon substrate (such as the bottom silicon layer 101), a silicon dioxide material region (such as the buried oxide layer 102), a silicon material region (such as the top silicon layer 103), a germanium material absorption region (such as the light absorption layer 120/absorption region 180), a silicon nitride resonant waveguide region (such as the resonant waveguide structure 150), a thermal regulation region (such as the thermal regulation structure 190), two metal electrodes (such as the first metal electrode 161 and the second metal electrode 162) and an input light port region (such as one end on the first waveguide portion 151 of the resonant waveguide structure 150 that receives the optical signal).

The silicon material region includes a P++ doped region (also referred to as P++ contact region, such as the first contact region 111) connected to the first metal electrode 161, a P+ doped charge region (also referred to as P+ doped region, such as the first charge region 113 and the second charge region 114), an I-intrinsic region 115, an N+ doped region 116, and an N++ doped region (also referred to as N++ contact region, such as the second contact region 117) connected to the second metal electrode 162.

The silicon nitride resonant waveguide region includes a silicon nitride straight waveguide (such as the first waveguide portion 151) and a silicon nitride racetrack-shape waveguide (such as the second waveguide portion 152).

The germanium material absorption region is embedded in the P+ doped charge region.

The silicon nitride racetrack-shape waveguide is located above the germanium material absorption region.

The two metal electrodes respectively connect the P++ doped region and the N++ doped region to form a lateral (also referred to as "transverse") electric field which is applied to the germanium material absorption region and the silicon material region.

In this way, the light passes through the silicon nitride racetrack-shape waveguide and slowly enters the germanium material absorption region through the evanescent wave coupling, and the germanium material absorbs photons to generate carriers; and the electric field applied externally extracts photogenerated carriers to form the current, thereby achieving the photoelectric signal conversion. The silicon germanium avalanche detector with the resonant waveguide structure in this embodiment can achieve high gain, large bandwidth, high quantum efficiency and wavelength selective avalanche photoelectric detection due to the strong coupling of the silicon nitride resonant waveguide with the germanium material absorption region and embedding of the germanium material absorption region in the silicon material region.

An avalanche photodetector and a method of manufacturing the avalanche photodetector according to the embodiments of the present disclosure will be described below in detail with reference to sectional views of a device structure in fabrication of a photodetector with a resonant waveguide structure in FIG. 5a to FIG. 5i.

The photodetector with the resonant waveguide structure according to the embodiments of the present disclosure may be prepared by the following method.

First, a substrate is provided.

Figure 5A:
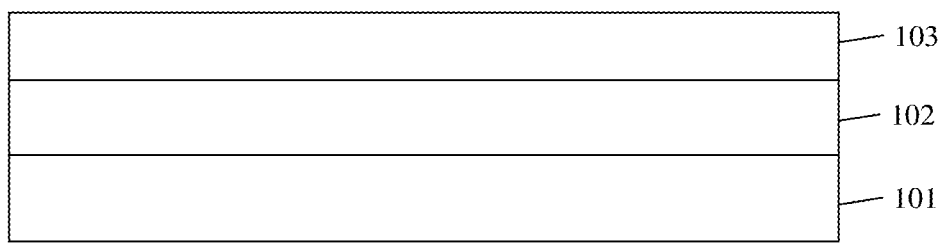
FIG. 5a to FIG. 5i are sectional views of a device structure in fabrication of a photodetector with a resonant waveguide structure according to an embodiment of the present disclosure.

Referring to FIG. 5a, the substrate is provided. The substrate may be an elemental semiconductor material substrate (such as a silicon (Si) substrate, a germanium (Ge) substrate, etc.), a composite semiconductor material substrate (such as a silicon germanium (SiGe) substrate, etc.), a silicon-on-insulator (SOI) substrate and a germanium-on-insulator (GeOI) substrate, etc.

In the embodiments of the present application, the substrate is the SOI substrate as an example for description. The SOI substrate provides a first semiconductor material region for the photodetector through the top silicon layer 103 to form a device active region, that is, a silicon layer is provided. The substrate also includes a buried oxide layer 102 under the top silicon layer 103 and a bottom silicon layer 101. For example, the buried oxide layer 102 is a silicon dioxide layer. The bottom silicon layer 101 may have a thicker thickness than the top silicon layer 103.

In one embodiment, the substrate is an elemental semiconductor material substrate and may provide the first semiconductor material region for the photodetector through the partial region near the upper surface layer to form the device active region.

Next, etching process is performed on the substrate (the first semiconductor material region) to form a groove into the interior of the substrate.

Figure 5B:
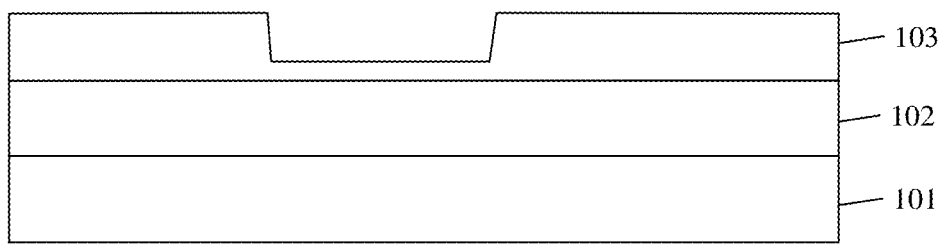

Referring to FIG. 5b, in the embodiment where the substrate is the silicon-on-insulator substrate, the operation of performing the etching process on the substrate includes forming the groove with a bottom end located in the top silicon layer 103. Specifically, the lower surface of the groove may be higher than the lower surface of the top silicon layer 103, so that the buried oxide layer 102 is not exposed.

In an actual process, a region where the groove needs to be etched may be firstly defined by patterning and then the etching process is performed. Specifically, a certain thickness of silicon is removed by using processes such as photolithography, electron beam exposure and etching (e.g., inductive plasma etching) to form the groove.

Next, selective epitaxial growth process is performed to form the first epitaxial growth layer in the groove, and the material of the first epitaxial growth layer is a second semiconductor material different from the first semiconductor material. The first epitaxial growth layer is formed as the light absorption layer of the photodetector, which is configured for detecting an optical signal.

Figure 5C:
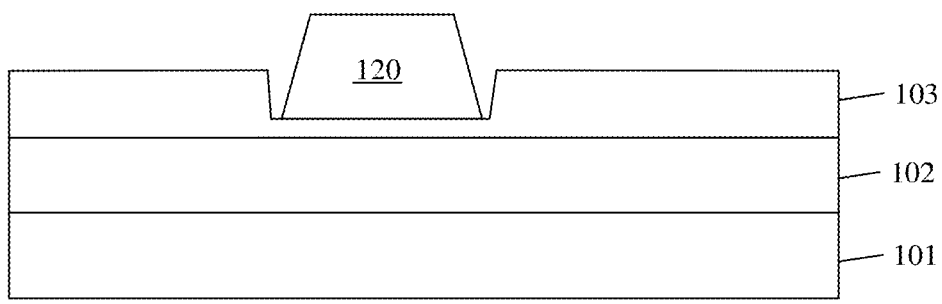

Referring to FIG. 5c, the light absorption layer 120 is formed on the top silicon layer 103 exposed by the groove. The material of the light absorption layer 120 is the second semiconductor material that is different from the first semiconductor material provided by the substrate.

In the embodiments where the first semiconductor material provided by the substrate is silicon, the second semiconductor material is germanium.

In the actual process, a polycrystalline germanium material with high quality may be selectively grown in the groove region by virtue of the process such as the molecular beam epitaxial growth.

It can be realized that the lower surface of the light absorption layer only covers a partial region of the lower surface of the groove or covers a whole region of the lower surface of the groove by controlling the dimension and position of the mask defining the light absorption layer formation region.

With continued reference to FIG. 5c, the operation of forming the light absorption layer 120 includes: forming the light absorption layer 120 having an upper surface higher than the upper surface of the substrate (refer to the top silicon layer 103 in FIG. 5c).

In the actual process, after performing the epitaxial growth process to grow the light absorption layer of the second semiconductor material, an operation of performing planarization on the upper surface of the second semiconductor material is further included, specifically, the planarization may be performed by the CMP process, so that the light absorption layer has a substantially planar upper surface.

Next, the method may further include an operation of forming the second epitaxial growth layer. The second epitaxial growth layer is located between the substrate and the light absorption layer, one side of the second epitaxial growth layer is in contact with the substrate, and the other side is in contact with the light absorption layer. The material of the second epitaxial growth layer is the first semiconductor material, that is, it is the same as the material that is provided by the substrate for forming the device active region.

Figure 5D:
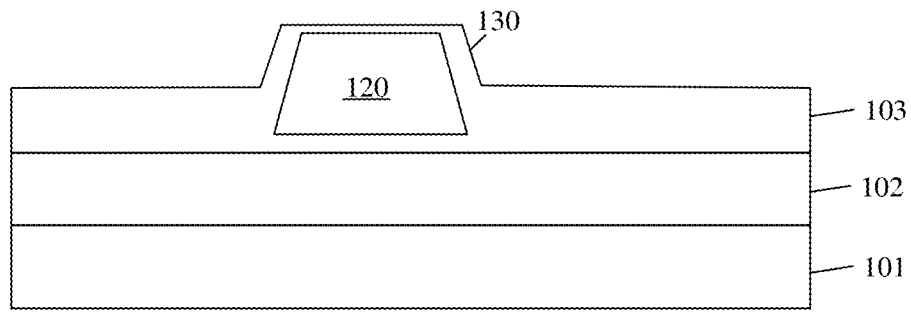
Figure 5E:
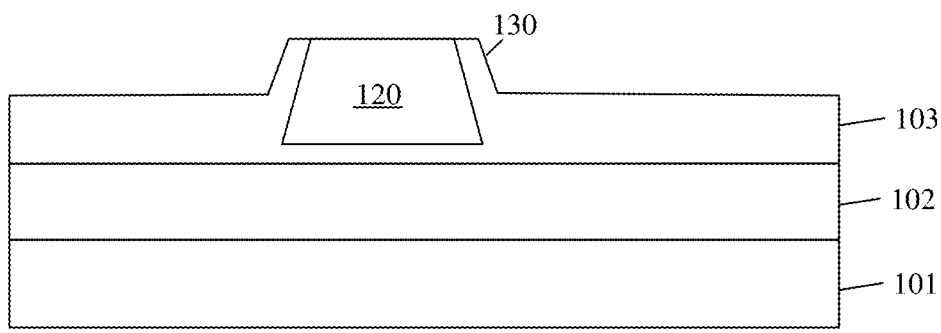

FIG. 5d and FIG. 5e are referred. First, referring to FIG. 5d, the selective epitaxial growth process is performed again to selectively grow the first semiconductor material, such as a polysilicon material, on the groove and the light absorption layer 120, so as to form the second epitaxial growth layer 130 which is used to fill the groove and cover sidewalls of the light absorption layer. The second epitaxial growth layer 130 may firstly cover the whole light absorption layer 120.

By controlling the dimension and position of the mask defining the second epitaxial growth layer formation region, it can be realized that the second epitaxial growth layer is entirely located in the groove, or partially located in the groove and partially located on the upper surface of the first semiconductor material region. In addition, corresponding to the case that the light absorption layer is in the groove and only covers the partial region of the lower surface of the groove or covers the whole region of the lower surface of the groove, the lower surface of the second epitaxial growth layer may be in contact with the upper surface and the lateral surface of the substrate (top silicon layer) exposed by the groove, or only in contact with the lateral surface of the substrate (top silicon layer) exposed by the groove. The specific structure may refer to FIG. 4a to FIG. 4e and the related description in the above embodiments of the photodetector with the resonant waveguide structure, which are not described in detail herein.

Next, referring to FIG. 5e, the planarization process is performed so that the upper surface of the second epitaxial growth layer 130 is at least partially coplanar with the upper surface of the light absorption layer 120.

In the actual process, the CMP process may be used to process the polysilicon material above the germanium material so that only the polysilicon on both sides of the germanium material is kept.

Since the material of the second epitaxial growth layer is the same as the material of the first semiconductor material region on the substrate, the second epitaxial growth layer and the first semiconductor material region may be used as indiscriminate material regions subsequently, and the boundaries between them may not be clearly divided.

Next, selective doping process is performed to form a multiplication region of the photodetector, and the light absorption layer is formed as an absorption region of the photodetector. The absorption region and the multiplication region at least partially overlap along the direction of the plane of the substrate. The photodetector is the avalanche photodetector.

Figure 5F:
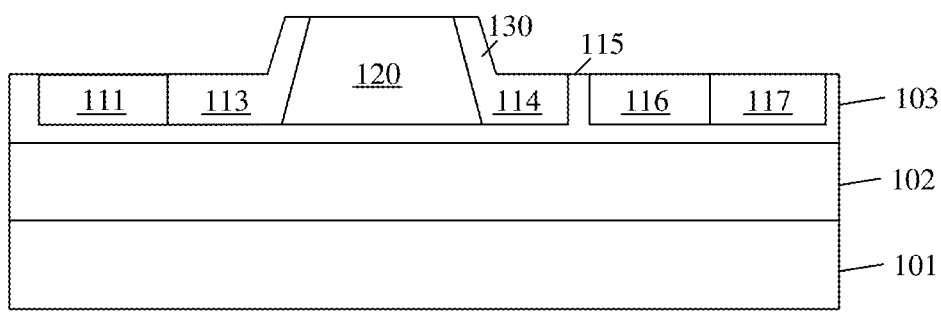

Referring to FIG. 5f, the operation of performing the selective doping process may include: P-type doping is performed on the second epitaxial growth layer 130. Since the second epitaxial growth layer 130 and the first semiconductor material region are not clearly divided, the P-type doping may be partially performed on a partial region of the first semiconductor material region that is in contact with the second epitaxial growth layer 130.

By performing P-type doping, P+ doped charge region adjacent to the light absorption layer is formed. The charge region may be a part of the multiplication region.

In one embodiment, the P-type doping may be performed on both sides of the light absorption layer such that the light absorption layer 120 include two charge regions on both sides thereof. That is, the operation of performing the selective doping process may further include: a first charge region 113 and a second charge region 114 are formed on both sides of the light absorption layer 120, respectively.

In addition, the operation of performing the selective doping process may further include: a first contact region 111 and a second contact region 117 with opposite doping types are formed in the substrate. The multiplication region and the absorption region are located between the first contact region 111 and the second contact region 117. For example, the first contact region 111 is a P++ contact region, and the second contact region 117 is an N++ contact region.

The operation of performing the selective doping process may further include: an N+ doped region 116 is formed between the light absorption layer 120 and the second contact region 117, specifically between the charge region (the second charge region 114) and the second contact region 117.

At least one un-doped I-intrinsic region 115 is included between the charge region and the second contact region 117. Thus, the multiplication region includes a P+ doped region (charge region), an I-intrinsic region (avalanche region) and an N+ doped region which are sequentially arranged along a direction away from the light absorption layer 120.

In the embodiment including the first charge region 113 and the second charge region 114 located on both sides of the light absorption layer 120, the first contact region 111 is in contact with the first charge region 113 directly. In this manner, the first contact region 111, the first charge region 113, the second charge region 114, the I-intrinsic region 115 and the N+ doped region 116 are sequentially formed on the substrate along the first direction (i.e., the direction in which the absorption region and the multiplication region are sequentially arranged). The absorption region (light absorption layer 120) is located between the first charge region 113 and the second charge region 114.

Figure 5G:
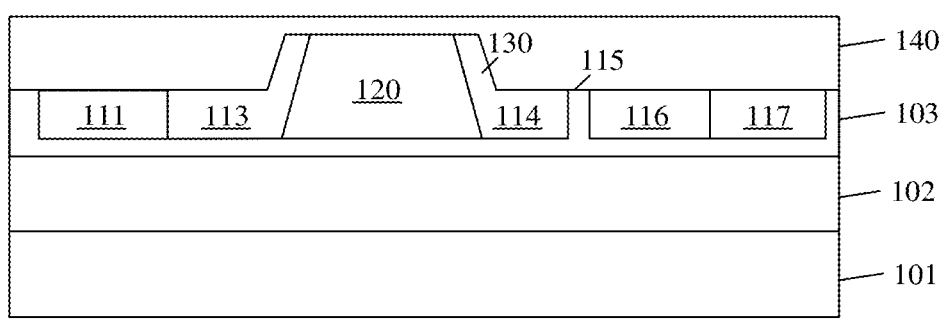

Next, referring to FIG. 5g, a fill layer 140 is formed on the substrate, specifically on the top silicon layer, the light absorption layer and the second epitaxial growth layer.

The material of the fill layer 140 may include silicon dioxide.

In the actual process, the fill layer 140 may be formed by depositing the silicon dioxide material with a certain thickness may and performing the planarization process.

Next, the method further includes forming a resonant waveguide structure. The resonant waveguide structure includes a first waveguide portion and a second waveguide portion spaced apart from each other. The first waveguide portion is configured to receive an optical signal and transmit the received optical signal to a first region of the second waveguide portion. The second waveguide portion further includes a second region configured to couple the optical signal to the light absorption layer, and the second waveguide portion has a circular optical signal transmission path, so as to transmit the optical signal that transmitted to the first region to the second region along part of the circular transmission path and retransmit the optical signal that flows through the second region without being coupled to the light absorption layer to the second region along the circular transmission path.

Figure 5H:
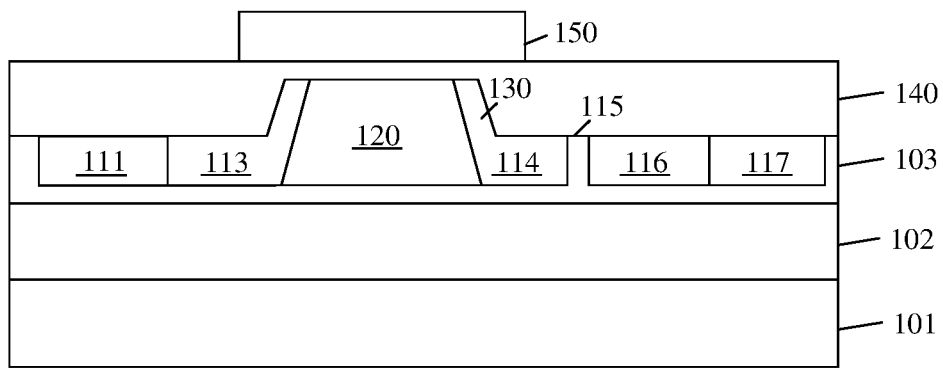

Referring to FIG. 5h, the resonant waveguide structure 150 is formed.

In the actual process, a region where the resonant waveguide structure 150 needs to be formed may be defined on the fill layer 140 above the light absorption layer 120 by a patterned mask layer (not shown in FIG. 5h), and waveguide material is formed (e.g., depositing the silicon nitride material or growing the silicon material) in the region to form the resonant waveguide structure 150. Specifically, for example, two separate regions are defined on the fill layer 140, the first waveguide portion is formed in one region, and the second waveguide portion is formed in the other region.

The specific structure of the formed resonant waveguide structure 150 may refer to FIG. 1B, FIG. 2 and FIGS. 3a-3b.

Figure 5I:
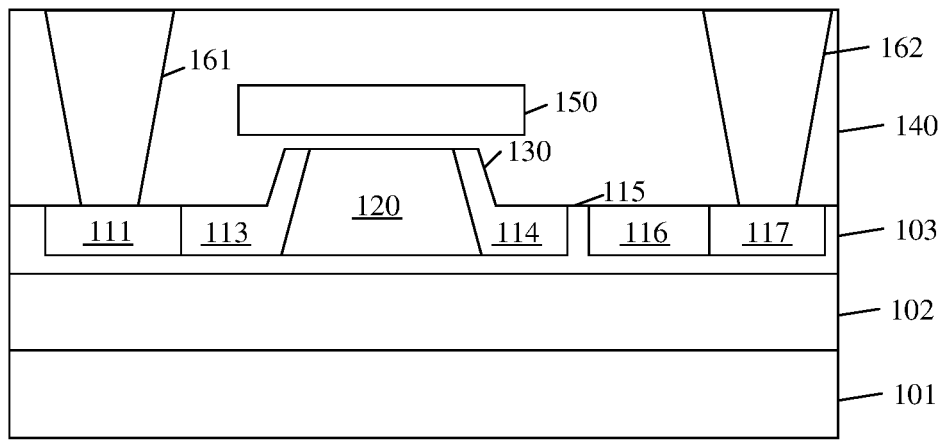

Next, referring to FIG. 5i, the method further includes forming a first metal electrode 161 and a second metal electrode 162 arranged perpendicular to a direction of the plane of the substrate (i.e., the second direction). The first metal electrode 161 and the second metal electrode 162 are in contact with the first contact region 111 and the second contact region 117, respectively.

Specifically, the two metal electrodes may be fabricated by the process such as opening a window via photolithography and inductive plasma etching and depositing a metal material via magnetron sputtering.

The upper surfaces of the first metal electrode 161 and the second metal electrode 162 should be higher than the upper surface of the resonant waveguide structure 150 (at least higher than the second waveguide portion). Specifically, the fill layer is formed on the resonant waveguide structure 150, and a window exposing the first contact region 111 and the second contact region 117 is formed in the fill layer by the process such as photolithography and etching (e.g., inductive plasma etching), and electrode material is filled in the window (e.g., depositing a metal material by magnetron sputtering) to form the first metal electrode 161 and the second metal electrode 162.

In addition, the method may further include the operation of forming a thermal regulation structure. In particular, the thermal regulation structure may be formed by forming TiN material in the fill layer 140. The thermal regulation structure is formed around the third region of the second waveguide portion. In a specific embodiment, the third region and the second region of the second waveguide portion are disposed opposite to each other, and the first region connects the second region and the third region. The thermal regulation structure is configured to regulate temperature to change an operation wavelength of the photodetector.

The preparation of the photodetector is substantially completed. Subsequent interconnection processes may be involved and will not be discussed herein.

It is to be noted that the embodiments of the photodetector with the resonant waveguide structure provided in the present disclosure belong to the same concept as the embodiments of the preparation method thereof. The technical features described in the technical solutions of the embodiments may be arbitrarily combined without conflict. However, it is to be further noted that the photodetector with the resonant waveguide structure provided in the embodiments of the present disclosure has solved the technical problems to be solved by the present disclosure through combining various technical features thereof. Thus, the photodetector with the resonant waveguide structure provided in the embodiments of the present disclosure may not be limited by the preparation method provided in the embodiments of the present disclosure, and any photodetector with the resonant waveguide structure prepared by the method capable to prepare the photodetector with the resonant waveguide structure provided in the embodiments of the present disclosure is within the protection scope of the present disclosure.

The above is merely the optional embodiments of the present disclosure and not intended to limit the protection scope of the present disclosure. Any modifications, equivalents or improvement within the spirit and principle of the present disclosure are intended to be included within the protection scope of the present disclosure.

The invention claimed is:

1. A photodetector with a resonant waveguide structure, comprising:
   a substrate (101, 102, 103);
   a light absorption layer (120) located on the substrate (101, 102, 103), configured for detecting an optical signal; and
   the resonant waveguide structure, comprising a first waveguide portion (151) and a second waveguide portion (152) spaced apart from each other; wherein,
   the first waveguide portion (151) is configured to receive the optical signal and transmit the received optical signal to a first region (152-1) of the second waveguide portion (152);
   the second waveguide portion (152) further comprises a second region (152-2) configured to couple the optical signal to the light absorption layer (120), and the second waveguide portion (152) is configured to provide a circular transmission path for transmission of the optical signal, so as to transmit the optical signal that transmitted to the first region (152-1) to the second region (152-2) along part of the circular transmission path and retransmit the optical signal that flows through the second region (152-2) without being coupled to the light absorption layer (120) to the second region (152-2) along the circular transmission path;
wherein the second waveguide portion (152) has a smaller ring width in the second region (152-2) than that in the first region (152-1); and
wherein the ring width represents a distance between an outer wall and an inner wall of the second waveguide portion (152) in a direction perpendicular to a transmission direction of the optical signal.

2. The photodetector with the resonant waveguide structure of claim 1, wherein the resonant waveguide structure is a silicon nitride resonant waveguide structure.

3. The photodetector with the resonant waveguide structure of claim 1, wherein the ring width of the second waveguide portion decreases gradually in a front end region of the second region and increases gradually in a rear end region of the second region along the transmission direction of the optical signal; and
the front end region is a region on the second waveguide portion where the optical signal is transmitted to the second region, and the rear end region is a region on the second waveguide portion where the optical signal is transmitted from the second region.

4. The photodetector with the resonant waveguide structure of claim 1, wherein the second region (152-2) of the second waveguide portion (152) is a straight waveguide region, and the second waveguide portion (152) comprises at least a curved waveguide region to connect to the straight waveguide region to form a portion of the circular transmission path.

5. The photodetector with the resonant waveguide structure of claim 4, wherein the first waveguide portion (151) is a straight waveguide, and an extension direction of the first waveguide portion (151) is perpendicular to an extension direction of the second region (152-2) of the second waveguide portion (152).

6. The photodetector with the resonant waveguide structure of claim 1, wherein the first waveguide portion (151) and the second waveguide portion (152) are sequentially arranged along a direction parallel to a plane of the substrate (101, 102, 103), and the first waveguide portion (151) is located outside the first region (152-1) of the second waveguide portion (152).

7. The photodetector with the resonant waveguide structure of claim 1, wherein
a spacing between the first waveguide portion (151) and the second waveguide portion (152) ranges from 150 nm to 600 nm.

8. The photodetector with the resonant waveguide structure of claim 1, wherein
the second region (152-2) of the second waveguide portion (152) is located right above the light absorption layer (120) and spaced a distance from an upper surface of the light absorption layer (120).

9. The photodetector with the resonant waveguide structure of claim 1, wherein
a spacing between the second region (152-2) of the second waveguide portion (152) and the light absorption layer (120) ranges from 100 nm to 1000 nm.

10. The photodetector with the resonant waveguide structure of claim 1, wherein the second waveguide portion (152) further comprises a third region (152-3); and
the photodetector further comprises a thermal regulation structure (190) disposed around the third region (152-3), and the thermal regulation structure (190) is configured to regulate a temperature to change an operation wavelength of the photodetector.

11. The photodetector with the resonant waveguide structure of claim 10, wherein
a spacing between the third region (152-3) of the second waveguide portion (152) and the thermal regulation structure (190) is greater than or equal to 1.5 µm.

12. The photodetector with the resonant waveguide structure of claim 10, wherein the third region (152-3) and the second region (152-2) of the second waveguide portion (152) are disposed opposite each other; and
the first region (152-1) connects the second region (152-2) and the third region (152-3).

13. The photodetector with the resonant waveguide structure of claim 10, wherein the third region (152-3) is a straight waveguide region, and an extension direction of the third region (152-3) is parallel to an extension direction of the second region (152-2).

14. The photodetector with the resonant waveguide structure of claim 1, further comprising at least two metal electrodes (161, 162); and
a spacing between the resonant waveguide structure and any of the at least two metal electrodes is greater than or equal to 500 nm.

15. The photodetector with the resonant waveguide structure of claim 1, wherein
the substrate (101, 102, 103) is a silicon-on-insulator substrate;
the light absorption layer (120) is a germanium layer; and
a bottom end of the light absorption layer (120) is embedded in a top silicon layer of the silicon-on-insulator substrate (101, 102, 103).

16. The photodetector with the resonant waveguide structure of claim 1, further comprising a multiplication region (185);
wherein the multiplication region (185) and the light absorption layer (120) are sequentially arranged along a direction parallel to a plane of the substrate (101, 102, 103) to form a transverse avalanche photodetector.

17. The photodetector with the resonant waveguide structure of claim 1, further comprising a first charge region (113) and a second charge region (114) formed in a partial region of the substrate (101, 102, 103), and the first charge region (113) and the second charge region (114) are located on both sides of the light absorption layer (120) along a direction parallel to a plane of the substrate (101, 102, 103).

18. A method for preparing a photodetector with a resonant waveguide structure, comprising:
providing a substrate (101, 102, 103);
forming a light absorption layer (120) located on the substrate (101, 102, 103), the light absorption layer (120) being configured for detecting an optical signal; and
forming the resonant waveguide structure, wherein the resonant waveguide structure comprises a first waveguide portion (151) and a second waveguide portion (152) spaced apart from each other, the first waveguide portion (151) is configured to receive the optical signal and transmit the received optical signal to a first region (152-1) of the second waveguide portion (152), the second waveguide portion (152) further comprises a second region (152-2) configured to couple the optical signal to the light absorption layer (120), and the second waveguide portion (152) is configured to provide a circular transmission path for transmission of the optical signal, so as to transmit the optical signal that transmitted to the first region (152-1) to the second region (152-2) along part of the circular transmission path and retransmit the optical signal that flows through the second region (152-2) without being coupled to the light absorption layer (120) to the second region (152-2) along the circular transmission path;

wherein the second waveguide portion (152) has a smaller ring width in the second region (152-2) than that in the first region (152-1); and wherein the ring width represents a distance between an outer wall and an inner wall of the second waveguide portion (152) in a direction perpendicular to a transmission direction of the optical signal.

19. The method of claim 18, further comprising:

forming a first metal electrode (161) and a second metal electrode (162) arranged perpendicular to a direction of a plane of the substrate (101, 102, 103).

\* \* \* \* \*